(12) United States Patent
Melanson

(10) Patent No.: US 6,384,761 B1
(45) Date of Patent: May 7, 2002

(54) SECOND AND HIGHER ORDER DYNAMIC ELEMENT MATCHING IN MULTIBIT DIGITAL TO ANALOG AND ANALOG TO DIGITAL DATA CONVERTERS

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/633,505

(22) Filed: Aug. 7, 2000

(51) Int. Cl.[7] .................................................. H03M 3/00
(52) U.S. Cl. ........................ 341/143; 341/144; 341/155; 341/118
(58) Field of Search ................................. 341/143, 144

(56) References Cited

U.S. PATENT DOCUMENTS 5,461,381 A * 10/1995 Seaberg ...................... 341/143
5,982,317 A * 11/1999 Stensgaard Madson ..... 341/143
6,266,002 B1 * 7/2001 Gong et al. .................. 341/150
6,304,608 B1 * 10/2001 Chen ........................... 341/143

* cited by examiner

Primary Examiner—Michael Tokar
Assistant Examiner—Lam T. Mai
(74) Attorney, Agent, or Firm—Jennifer L. Bales, Esq.; Dan A. Shifrin, Esq.

(57) ABSTRACT

A multibit data converter has an output parallel unit element converter fed by a multibit signal, and noise shaping dynamic element matching (DEM) apparatus for selectively activating units in the converter. The DEM apparatus includes a plurality of noise shaping components. Each components has as an input one signal to the converter, and each includes a first integrator having as its input the input to the component, and a second integrator having as its input the output of the first integrator, and forms one or more component outputs. A signal in the second integrator is clipped. A vector quantizer orders the component outputs and activates converter elements according to the ordering.

8 Claims, 9 Drawing Sheets

SECOND AND HIGHER ORDER DYNAMIC ELEMENT MATCHING IN MULTIBIT DIGITAL TO ANALOG AND ANALOG TO DIGITAL DATA CONVERTERS

BACKGROUND OF THE INVENTION

1. Field of the Invention

The present invention relates to second order and higher order dynamic element matching (DEM) in multibit digital to analog data converters (DACs) and analog to digital data converters (ADCs).

2. Description of the Prior Art

Multibit DACs and ADCs have many advantages over single bit design, including better choices of noise shaping and higher possible input signal range. The most significant drawback of multibit converters is the required matching between elements in order to achieve linearity and low noise.

High performance DACs and ADCs are useful in many applications, for example for the processing of audio signal, with the signal processing functions being performed in the digital domain, and for network modems, where high bandwidth and low noise are important. The preferred DACs and ADCs for these applications are based upon delta sigma modulators. Delta sigma modulation incorporates a noise-shaping technique whereby the noise of a quantizer operating at a frequency much greater than the bandwidth is moved to frequencies not of interest in the output signal. A filter after the quantizer removes the out of band noise. The resulting system synthesizes a high resolution data converter, but is constructed from low resolution building blocks. A good overview of the theory of delta sigma modulation is given in "Delta-Sigma Data Converters," by Norsworthy, Schreier and Temes, IEEE Press, 1997. Another useful reference is "A 2.5MSample/s Multi-bit DS CMOS ADC with 95 dB SNR" by Geerts et al, ISSCC 2000/Paper WA 20.2, Feb. 9, 2000.

FIG. 1 shows a conventional multibit delta sigma DAC. A delta sigma DAC generally comprises a multibit noise shaping delta sigma modulator 104 having input signal 102 and feeding a thermometer type decoder 106. The output of decoder 106 is the input to parallel unit element DAC 108. The output of parallel unit element DAC 108 is analog signal 114. DAC 108 operates at the clock level of delta sigma modulator 104.

In a delta sigma converter, there are three major factors which contribute to dynamic range, the order of the loop (generally the number of cascaded integrators in the loop filter), the number of levels of the quantizer, and the over sample ratio. In practice, delta sigma modulators are generally at least second order, because higher order modulators better reduce noise in the signal band, due to improved prediction of the in band quantization error. Thus, the resulting signal to noise ratio is better. U.S. Pat. No. 5,461,381 provides a good reference on implementation details of switched capacitor sigma delta converters.

An M+1 level parallel unit element DAC 108 can be built using M elements 110 since the possible digital output levels range from 0 elements being active up to M elements being active. The Kth output level is generated by activating K approximately equal-valued elements 110 (typically resistors, transistor current sources or capacitors) and summing the charges or currents in summer 112 to generate the analog output signal 114. Parallel unit element DAC 108 produces relatively few output levels, but the levels must be extremely accurate.

Element mismatch can be converted into an out of band noise signal (later filtered out) using dynamic element matching (DEM). One DEM technique, called dynamic element rotation, is shown in FIG. 2 (Prior Art). Dynamic element rotation modulates the nonlinearity error around the subharmonics of the sampling clock frequency by making the mismatch noise a periodic signal. Rather than driving DAC 108 directly, decoder 202 feeds a barrel shifter 204, which rotates the connections between thermometer decoder 202 and DAC 108 each clock pulse (per counter 206). The counter in incremented by the number of elements used in each cycle. This guarantees that all elements are used equally over the long term, which shapes the mismatch noise in a first order way. The drawback of this system is that the remaining noise tends to be tonal for certain inputs, which is generally undesirable.

FIG. 3 (Prior Art) shows another possible DEM technique. M noise shaping elements 301 each have nominal transfer function of $H_2$. Vector quantizer 310 sorts the M sy inputs, and assigns a 1 to the v greatest elements, where v is the current output of multibit delta sigma converter 104. The noise shaping loop of elements 301 comprises filter 311 and adders 312 and 313. Minimize block 320 keeps all of the noise shaping loops 301 in a bounded range. For second order noise shaping, $H_2$ is chosen as $(1-z^{-1})^2$. Thus, the transfer function of block 311 is $-2z^{-1}+z^{-2}$. The assumption that the added noise is white is a very poor one, and the performance of such a system is limited. Vector quantizer 310 is forced to make "bad" decisions, as there is only one way (for example) to pick 4 out of 4 elements. In addition, it is easy for overload of the state variables of filter 311 to occur, especially with a high input signal. When this happens, the noise shaping is lost. For more detail, refer to "Delta-Sigma Data Converters," by Norsworthy, Schreier and Temes, IEEE Press, 1997, chapter 8.

FIG. 4 (Prior Art) is a block diagram which shows a delta sigma digital to analog converter equivalent to that shown in FIG. 3. Each second order noise shaper 401 includes a clipper 406. Like the noise shaper of FIG. 3 (prior art), noise shaper 401 has a block transfer function of $1-2z^{-1}+z^{-2}$. When clipping does not occur, this system performs as a second order noise shaper. In this implementation, vector quantizer 410 finds the smallest v elements of sy (where v is the current output of delta sigma modulator 106), as the output of 410 is assumed to be positive for selected elements.

Note that the first integral of the past error is lost in the FIG. 4 system when clipping happens. In simulation, it is found that overflow is relatively common, especially for high level inputs. When overflow does take place, the performance degrades dramatically.

A need remains in the art for improved second and higher order dynamic element matching for multibit data converters.

SUMMARY OF THE INVENTION

An object of the present invention is to provide improved second and higher order dynamic element matching for multibit data converters.

In a multibit data converter having an output parallel unit element converter fed by a multibit signal, noise shaping dynamic element matching apparatus for selectively activating units in the converter comprises a plurality of noise shaping components, each having as an input one signal to the converter, including a first integrator having as its input the input to the component, a second integrator having as its input the output of the first integrator, and a summer for adding the output of the first integrator and the output of the second integrator to form a component output, wherein a signal in the second integrator is clipped; and a vector quantizer for ordering the component outputs and activating converter elements according to the ordering.

The gain of the second integrator preferably is greater than zero and less than the gain of the first integrator. For efficiency, a selected signal to the parallel unit element converter can be provided as a component input, and this selected signal subtracted from the component inputs.

In another embodiment of a multibit data converter having an output parallel unit element converter fed by a multibit signal, the noise shaping dynamic element matching apparatus for selectively activating units in the converter comprises a plurality of noise shaping components, each having as an input one signal to the converter, each component including a first integrator having as its input the input to the component and providing a first output of the component, and a second integrator having as its input the output of the first integrator and providing a second output of the component, and a vector quantizer for ordering the component outputs and activating converter elements according to the ordering, the vector quantizer including means for giving the first outputs of the components higher priority in sorting than the second outputs.

Again, a selected signal to the parallel unit element converter may be provided as a component input and subtracted from the component inputs.

A method of dynamic element matching for selecting elements in an output parallel unit element converter comprises the steps, for each input signal to the parallel unit element converter, of generating a first integral of the input, generating a second integral of the input, and combining the first integral and the second integral to form a noise shaped signal. Next, the noise shaped signals are ordered, and elements in the parallel unit element converter are selected according to the order.

This method may further include the step of applying gains to at least one of the first integral or the second integral such that the gain of the second integral is greater than zero and less than the gain of the first integral, prior to combing the first integral and the second integral.

Another method of dynamic element matching for selecting elements in an output parallel unit element converter comprises the steps, for each input signal to the parallel unit element converter, of generating a first integral of the input and generating a first noise shaped signal based on the first integral, generating a second integral of the input and generating a second noise shaped signal based on the second integral. Then, the noise shaped signals are ordered such that the first noise shaped signals have higher priority in sorting than the second noise shaped signals, and elements in the parallel unit element converter are selected according to the order.

DETAILED DESCRIPTION OF THE PREFERRED EMBODIMENT

Figure 1:
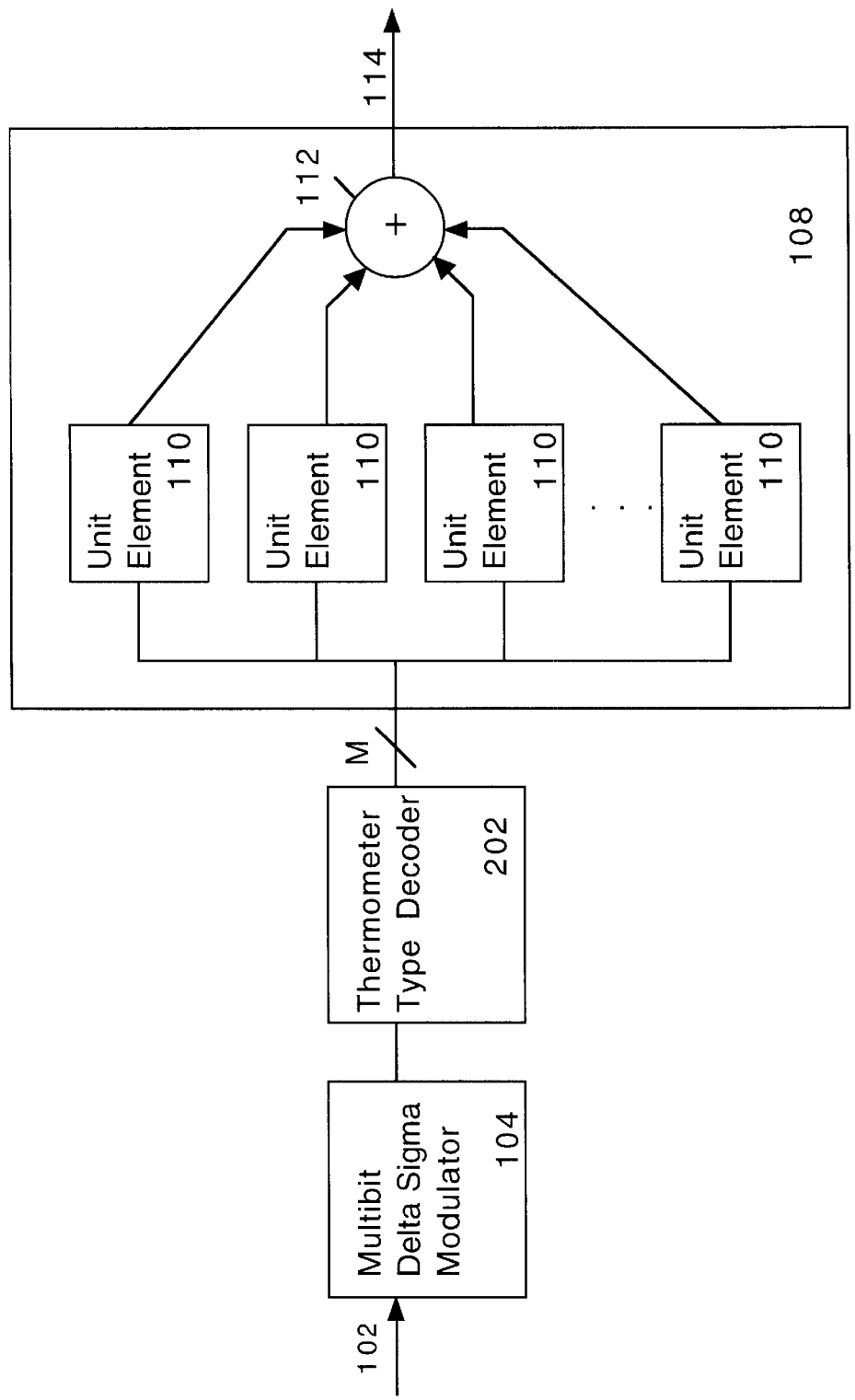
FIG. 1 (prior art) is a block diagram which shows a conventional multibit delta sigma digital to analog converter including a parallel unit element DAC.
Figure 2:
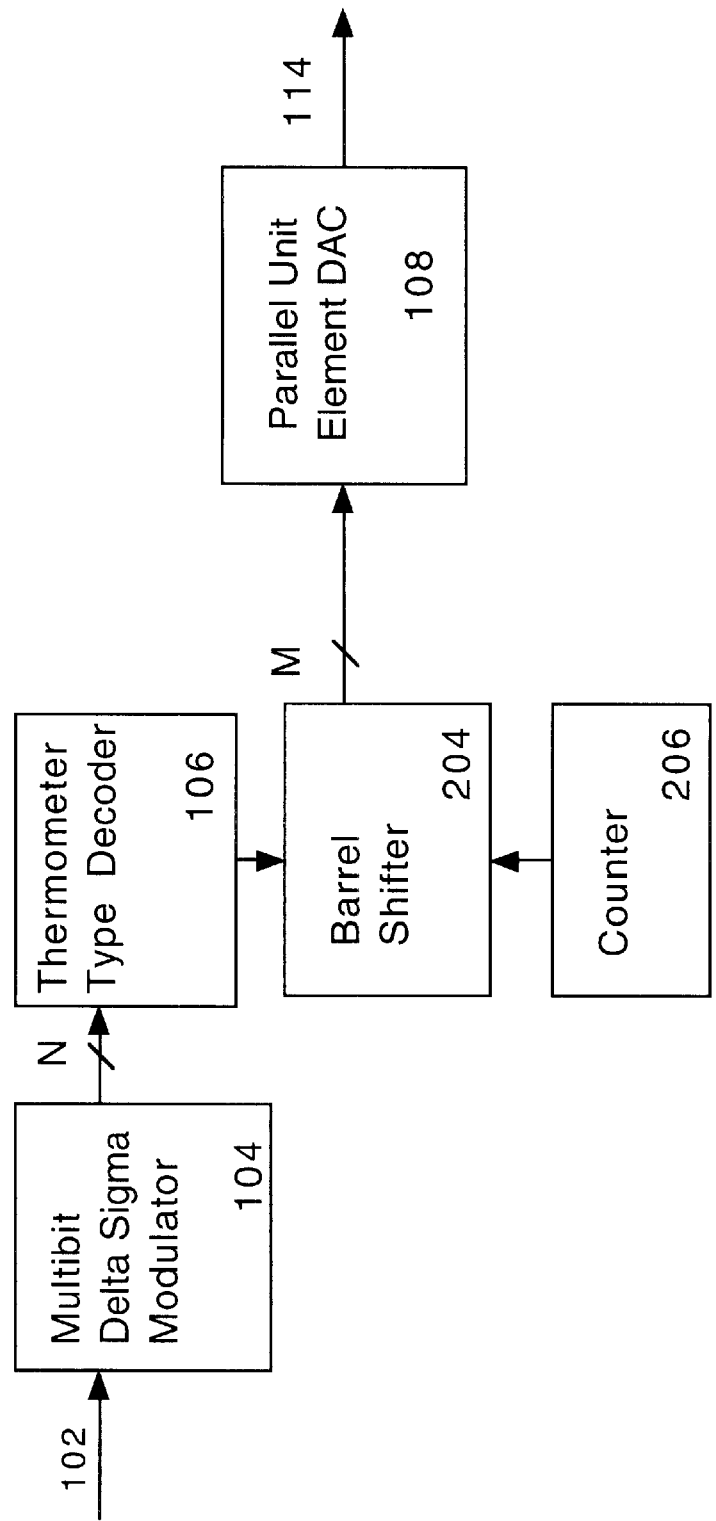
FIG. 2 (prior art) is a block diagram which shows the delta sigma digital to analog converter of FIG. 1, with dynamic element rotation circuitry inserted prior to the parallel unit element DAC.
Figure 5:
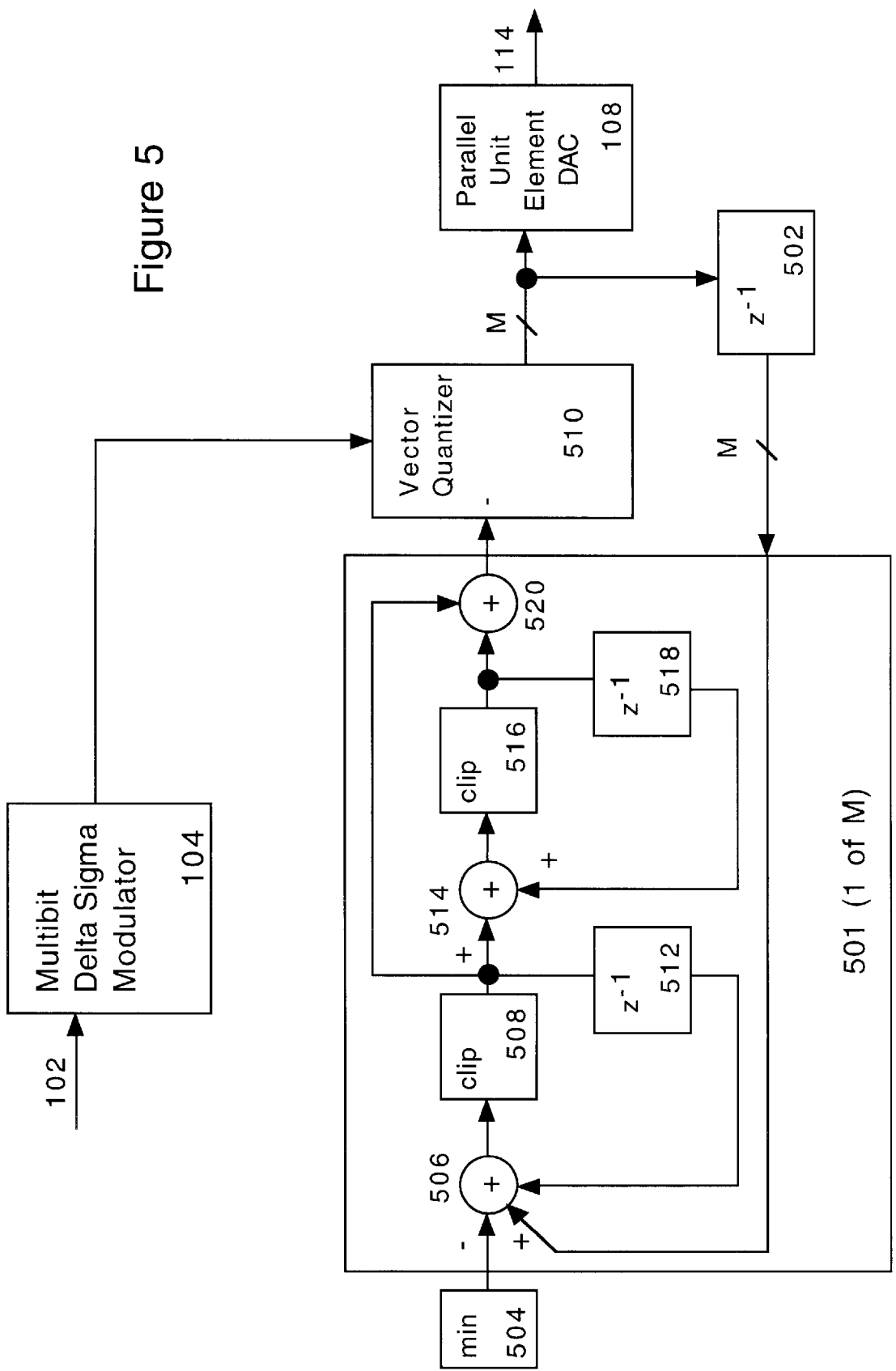
FIG. 5 is a block diagram which shows a first embodiment of a delta sigma digital to analog converter having improved noise shaped element usage circuitry between the delta sigma modulator and the parallel unit element DAC.

FIG. 5 is a block diagram which shows a first embodiment of a delta sigma digital to analog converter having improved noise shaped element usage circuitry between delta sigma modulator 104 and parallel unit element DAC 108. The usage of elements 110 of DAC 108 (see FIG. 1) is noise shaped by vector quantizer 510 in combination with M noise shaping elements 501. Each noise shaper 501 comprises an initial delay 502 and two cascaded integrators (506, 508, 512, and 514, 516, 518). Minimizer block 504 bounds the loops of noise shapers 501. Clippers 508 and 516 perform clipping when necessary. The output of clipper 508 is fed forward to adder 520. Again, the quantizer 510 chooses the lowest v numeric values of its inputs.

Note that delay 502 provides M single bit outputs sv, one for each noise shaper 501. It would be equivalent to have a single input/single output delay incorporated into each noise shaper 501. Each noise shaper 501 provides a multibit output signal sy to vector quantizer 510.

Figure 3:
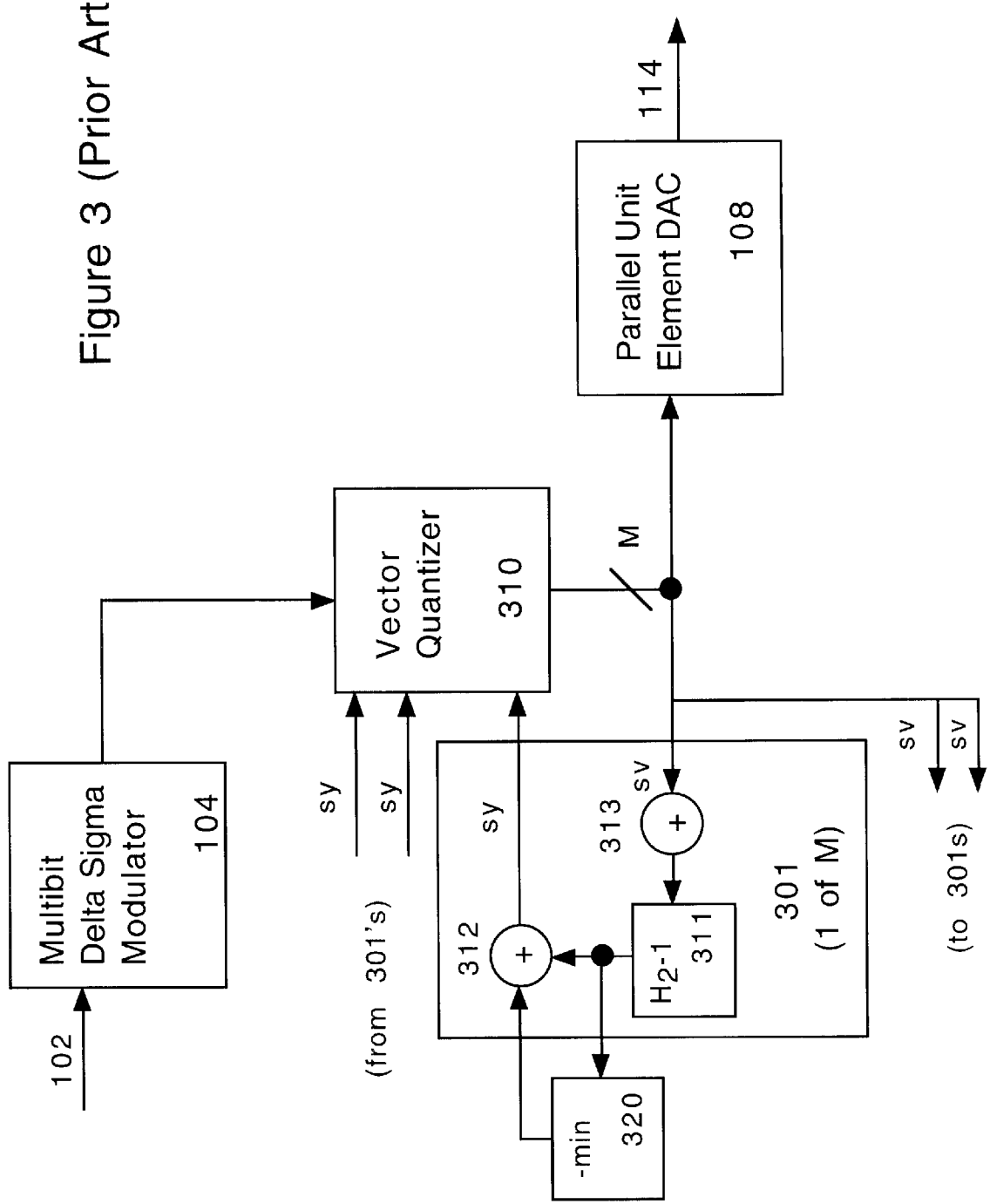
FIG. 3 (prior art) is a block diagram which shows the delta sigma digital to analog converter of FIG. 1, with noise shaped element usage circuitry inserted prior to the parallel unit element DAC.
Figure 4:
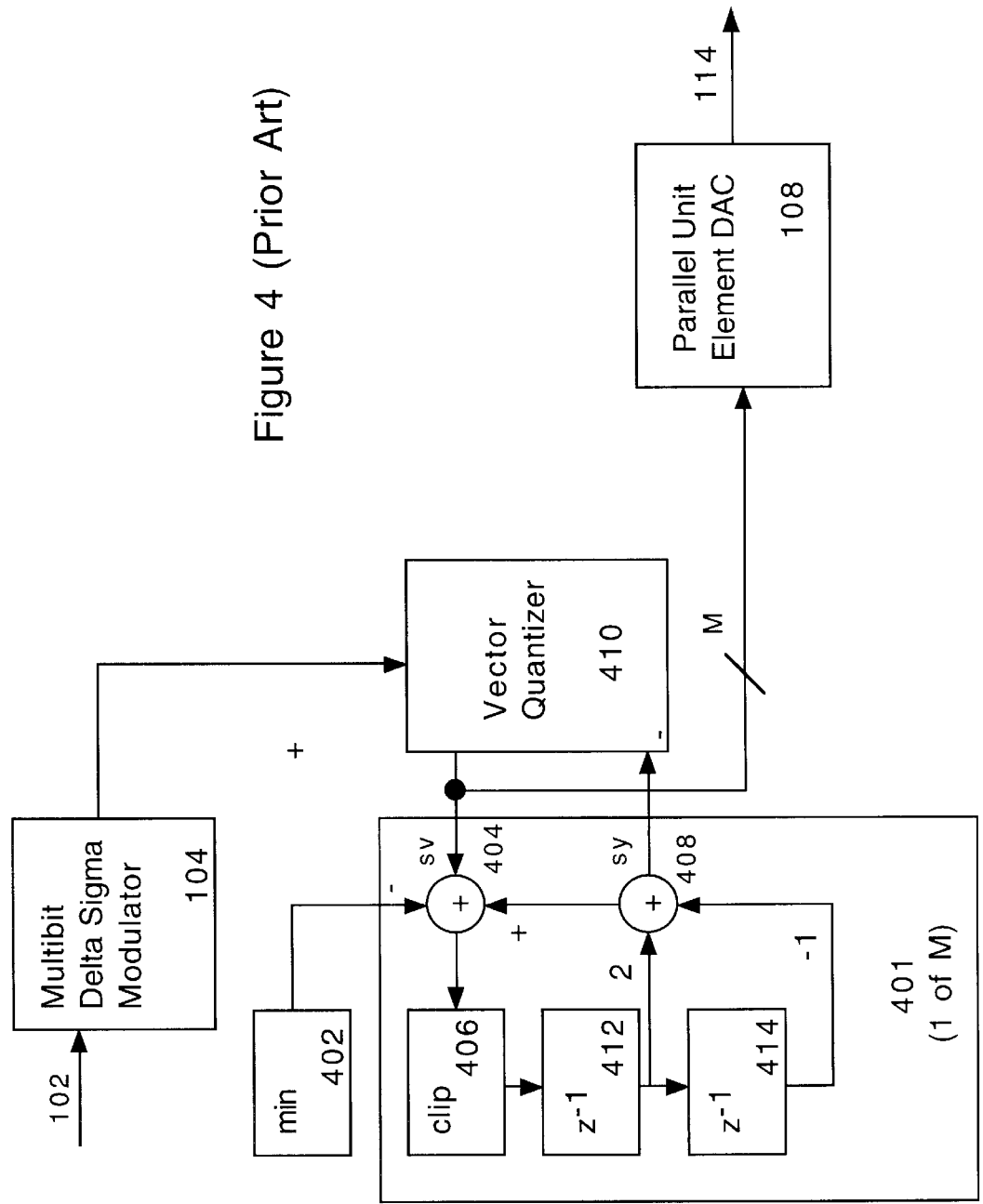
FIG. 4 (prior art) is a block diagram which shows a delta sigma digital to analog converter equivalent to that shown in FIG. 3.

Note that when clipping does not occur, the system of FIG. 5 performs identically to the systems of FIG. 3 and FIG. 4 (both prior art). When clipping does occur, however, the system of FIG. 5 is better behaved, because the state of the first integrator is not degraded as much by clipping as in the FIG. 4 system. It is possible to select word lengths such that clipping rarely, if ever, occurs in the first integrator. This guarantees that at least first order noise shaping is preserved when high input levels are present. In a simulation of an eight element system, with 5% matching error between elements, the system of FIG. 5 performed as much as 20 dB better than the FIG. 4 system for high input levels. The improvement is due to separately clipping the two integrals, as opposed to clipping one value that carries both pieces of information.

Figure 6:
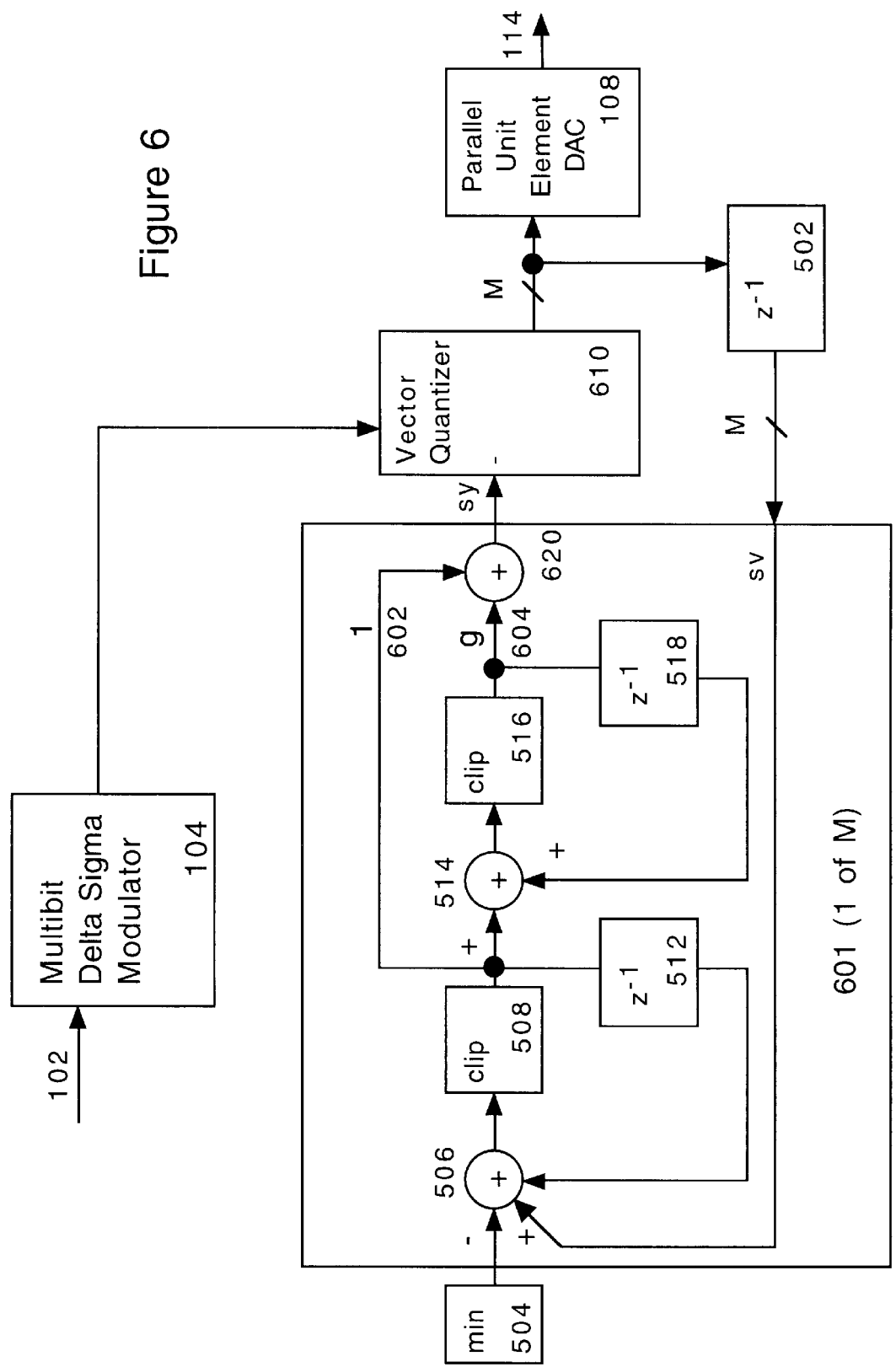
FIG. 6 is a block diagram which shows a second embodiment of a delta sigma digital to analog converter having improved noise shaped element usage circuitry between the delta sigma modulator and the parallel unit element DAC.

FIG. 6 is a block diagram which shows a second embodiment of a delta sigma digital to analog converter having improved noise shaped element usage circuitry between delta sigma modulator 104 and parallel unit element DAC 108. The system of FIG. 6 is an improvement over the system of FIG. 5. The relative gain of the two integrators, as presented to the vector quantizer, is now made to be variable. In the example of FIG. 6, the gain 602 of the first integrator is 1, and the gain 604 of the second integrator is g. This is an improvement, because it takes into account vector quantizer 610 as an additive noise source. The system of FIG. 6 with g equal to 0.5 results in an additional 10 dB of improvement over the system of FIG. 5, for high level input signals. A small improvement is seen for low input signal levels.

The improvement can be explained by analysis of the prior art. The theoretic second order noise shaping occurs under assumptions that are not true. In the classic analysis, the quantizer is modeled by additive white noise. In a DEM noise shaper, this is not an accurate model. The inputs to the modulator are severely quantized, and the quantizer has a variable threshold dependant on the state of other quantizers. The improvement in performance due to the change in relative gain is counter to the classic analysis, which would predict a decrease in performance. It is observed in the system of FIG. 3 that the noise shaper gets stuck for relatively long period in a state where it has no options to make the proper decisions, and the system moves further away from a well balanced state of operation. Increasing the gain of the first integration relative to the second provides a better pull back to the balanced state, and therefore performs better.

Figure 7:
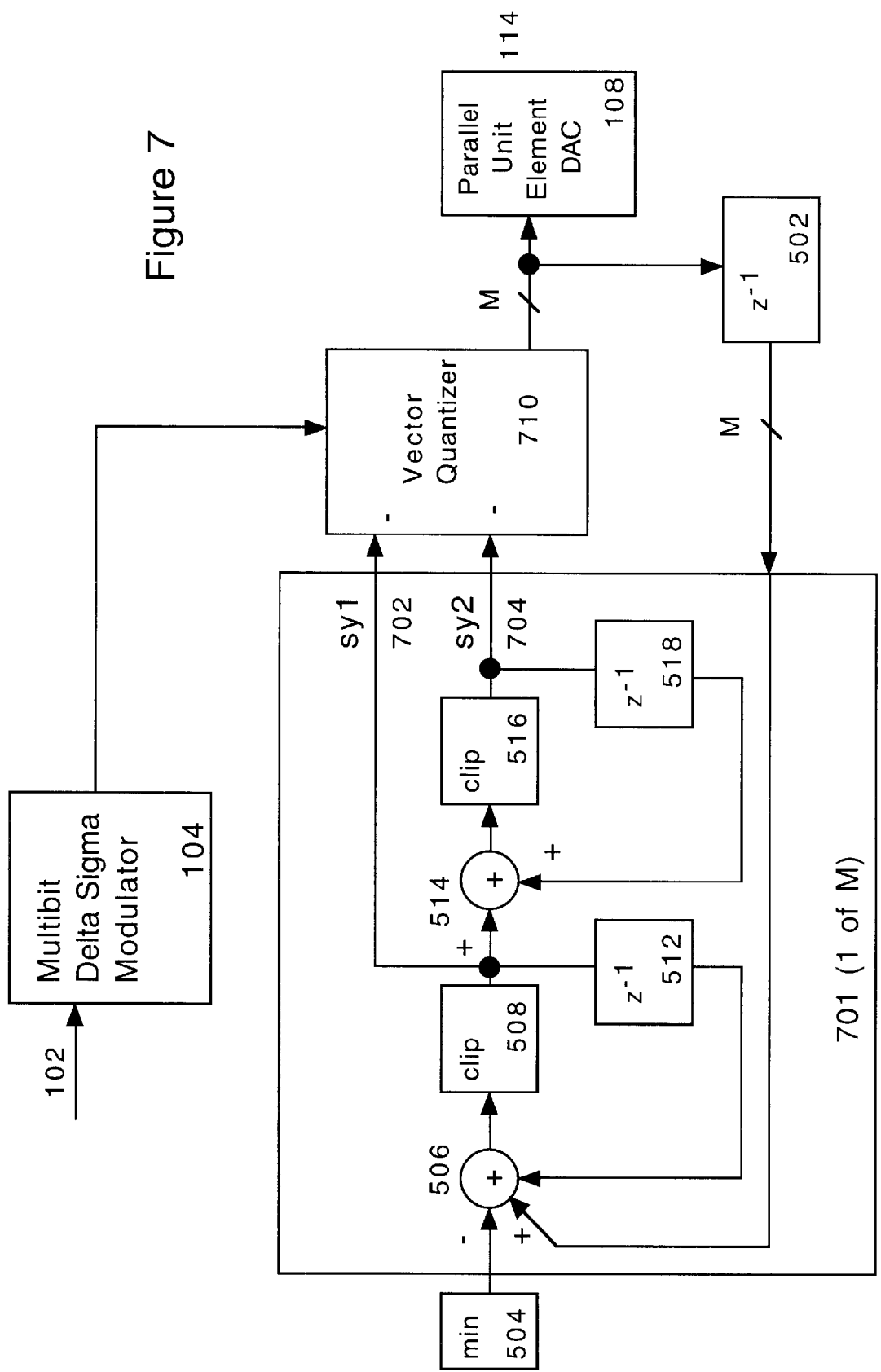
FIG. 7 is a block diagram which shows a third embodiment of a delta sigma digital to analog converter having improved noise shaped element usage circuitry between the delta sigma modulator and the parallel unit element DAC.

FIG. 7 is a block diagram which shows a third embodiment of a delta sigma digital to analog converter having improved noise shaped element usage circuitry between delta sigma modulator 104 and parallel unit element DAC 108. The system of FIG. 7 is an improvement over the system of FIG. 6. Each noise shaper 701 generates two signals, a first integral 702, or sy1, and a second integral 704, or sy2. Both integrals 702, 704 are inputs to vector quantizer 710.

Vector quantizer 710 sorts with first priority on input sy1 and second priority on input sy2. This is equivalent to making g arbitrarily small in the system of FIG. 6. The rules of 710 can be thought of as follows:

First, take the v elements with the lowest sy1 (first integral).

If there is a tie between multiple sy1 inputs, those with the lowest sy2 are chosen.

This is also equivalent to a binary comparison, where the sy1 is used for the high order bits, and sy2 is used for the low order bits.

If the previous embodiments can be thought of as filter based noise shapers, this embodiment can be thought of as a rule based noise shaper. The rule used is "Select v elements from M for use. As the primary selection criteria, select those v elements that have been used the least. As a secondary rule, select those where the integral of the usage (the second integral) is the lowest".

Figure 8:
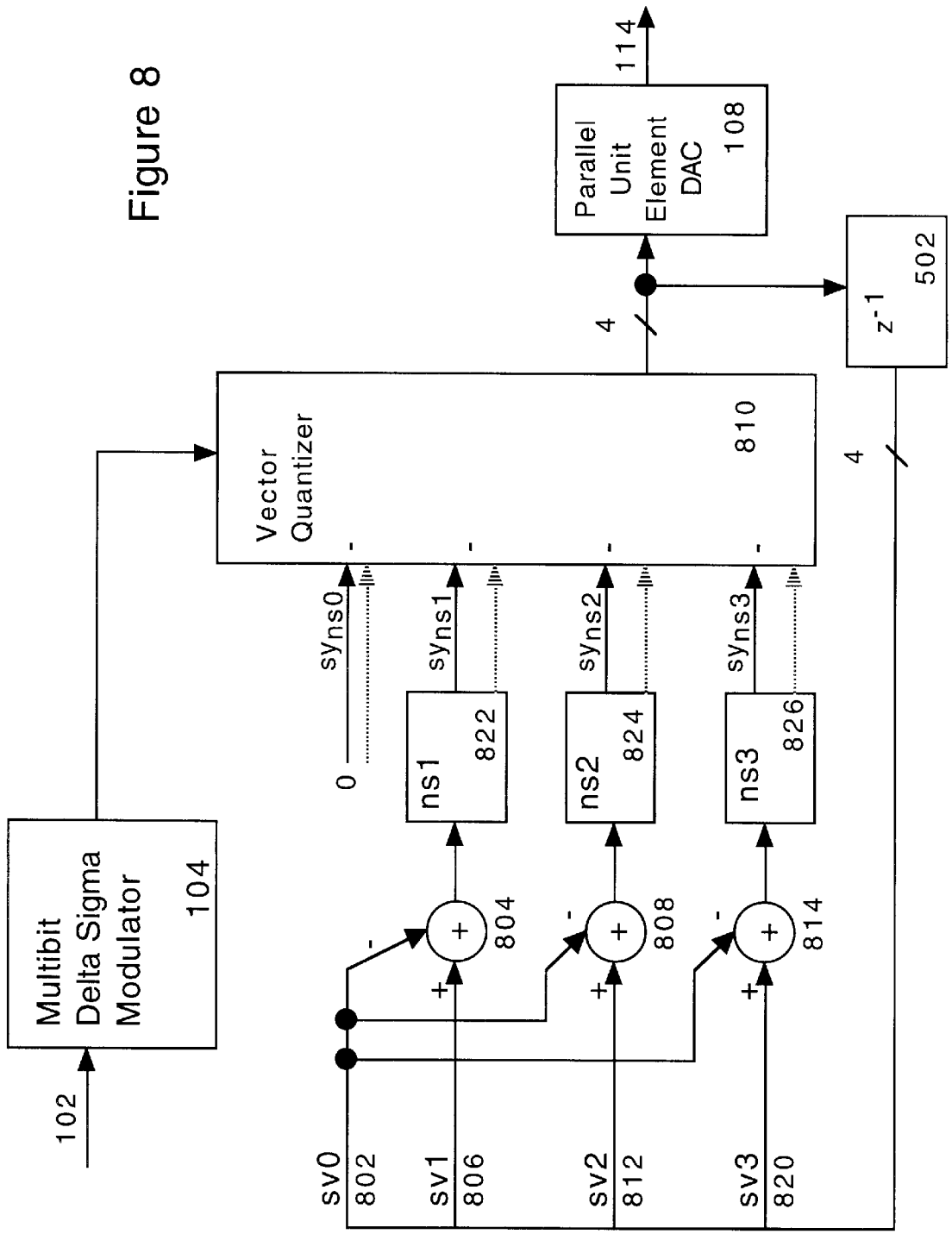
FIG. 8 is a block diagram which shows a fourth embodiment of a delta sigma digital to analog converter having improved noise shaped element usage circuitry between the delta sigma modulator and the parallel unit element DAC.

FIG. 8 is a block diagram which shows a fourth embodiment of a delta sigma digital to analog converter having improved noise shaped element usage circuitry between delta sigma modulator 104 and parallel unit element DAC 108. The example system of FIG. 8 uses four elements (M=4), but uses only 3 actual noise shapers, 822, 824, and 826. The 0th noise shaper is assumed to always have an output of 0, and has been removed (and its input, $sy_{ns0}$, has been set to zero). This is made possible by the observation that all of the outputs are used only in a relative sense, so one can arbitrarily be assumed to be 0, and the others made relative. The feedback value 802 for the 0th noise shaper is therefore subtracted by adders 804, 808, 814, from the input 806, 812, 820 to the other three noise shapers, 822, 824, and 826.

The first integrator is now tightly bounded. With rule based noise shaping, it can only take on the values −1, 0, and +1. Thus, the first clipper is no longer needed, and the second integrator is now only an up/down counter, which is very inexpensive to implement. In addition, one fewer shaping elements is required, for a given order of noise shaping. Note that vector quantizer 810 as shown receives 4 sy inputs, one from each noise shaper $Sy_{ns0}$, $Sy_{ns1}$, $sy_{ns2}$, and $sy_{ns3}$. In the case where rule based ordering is to be used, vector quantizer 810 would receive 8 sy inputs (as illustrated in dotted lines, and see FIG. 9). Noise shapers 822, 824, 826 are second order delta sigma modulators, such as noise shaper 601 of FIG. 6 or noise shaper 701 in FIG. 7. Min block 504 is no longer required.

The hardware of the vector quantizer is now simplified, as some of the comparisons are against 0, which is a very simple case to implement. In the illustrated case, 6 full comparisons (0:1 0:2 0:3 1:2 1:3 2:3) are replaced with three full comparisons and 3 against 0, which reduces the hardware for comparison by a factor of nearly 2.

Figure 9:
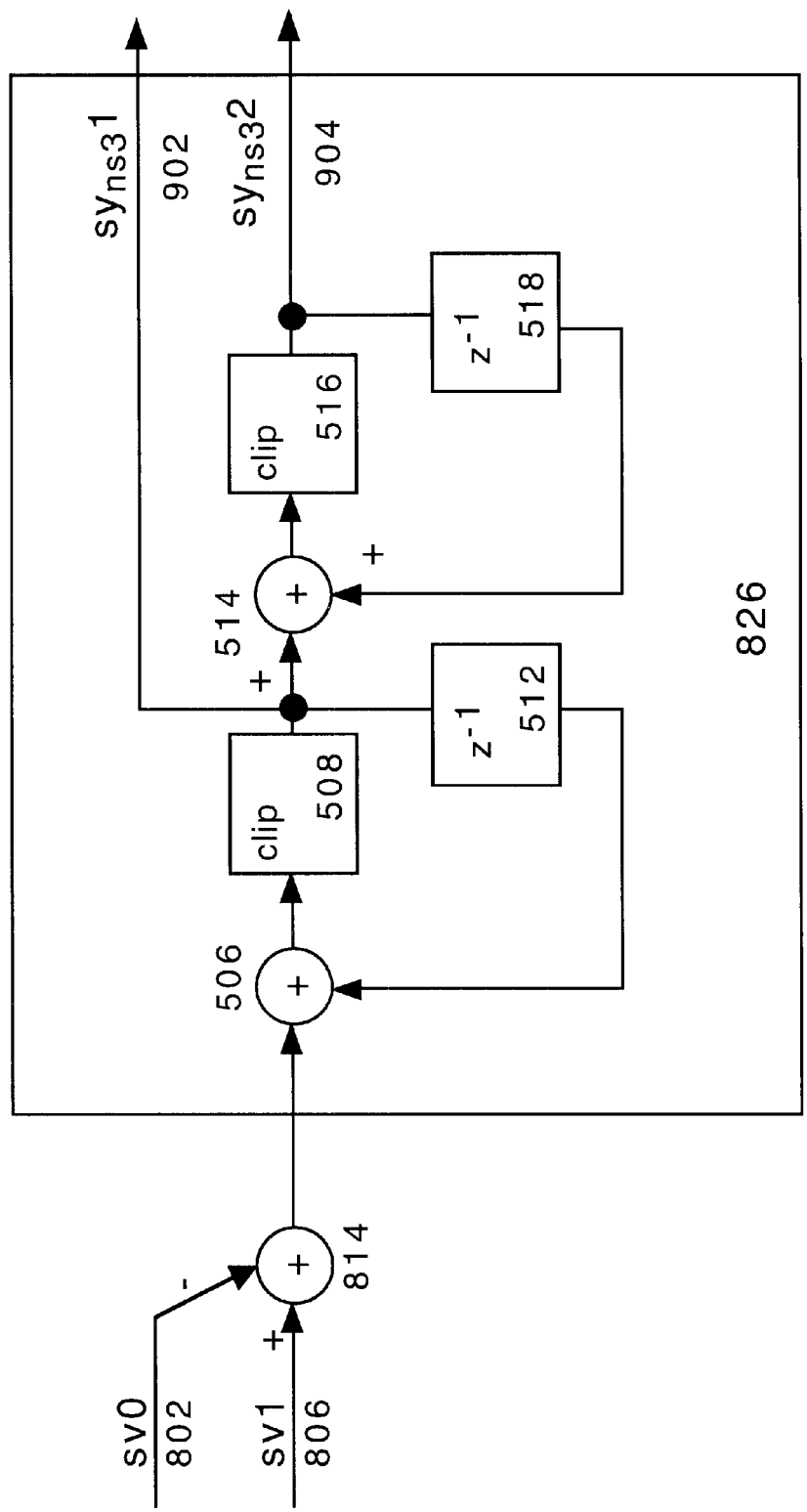
FIG. 9 is a block diagram showing a more detailed example of a noise shaper element of FIG. 8.

FIG. 9 is a block diagram showing a more detailed example of a noise shaper element 826 of FIG. 8. If rule based ordering is used in FIG. 8, noise shaper 801 generates two sy signals 902, 904 as shown and described with respect to FIG. 7.

While the exemplary preferred embodiments of the present invention are described herein with particularity, those skilled in the art will appreciate various changes, additions, and applications other than those specifically mentioned, which are within the spirit of this invention.

What is claimed is:

1. In a multibit data converter having an output parallel unit element converter fed by a multibit signal, noise shaping dynamic element matching apparatus for selectively activating units in the converter, the apparatus comprising:
    a plurality of noise shaping components, each having as an input one signal to the converter, each component including
        first integrator having as its input the input to the component,
        a second integrator having as its input the output of the first integrator, and
        a summer for adding the output of the first integrator and the output of the second integrator to form a component output,
        wherein a signal in the second integrator is clipped; and
    a vector quantizer for ordering the component outputs and activating converter elements according to the ordering.

2. The apparatus of claim 1, wherein the gain of the second integrator is greater than zero and less than the gain of the first integrator.

3. The apparatus of claim 1, wherein a selected signal to the parallel unit element converter is provided as a component input, and the selected signal is subtracted from the component inputs.

4. In a multibit data converter having an output parallel unit element converter fed by a multibit signal, noise shaping dynamic element matching apparatus for selectively activating units in the converter, the apparatus comprising:
    a plurality of noise shaping components, each having as an input one signal to the converter, each component including
        first integrator having as its input the input to the component and providing a first output of the component, and
        a second integrator having as its input the output of the first integrator and providing a second output of the component; and a vector quantizer for ordering the component outputs and activating converter elements according to the ordering, the vector quantizer including means for giving the first outputs of the components higher priority in sorting than the second outputs.

5. The apparatus of claim 4, wherein a selected signal to the parallel unit element converter is provided as a component input, and the selected signal is subtracted from the component inputs.

6. A method of dynamic element matching for selecting elements in an output parallel unit element converter comprising the steps of;

for each input signal to the parallel unit element converter
generating a first integral of the input,
generating a second integral of the input,
clipping a signal comprising the second integral, and
combining the first integral and the second integral to form a noise shaped signal;
ordering the noise shaped signals; and
selecting elements in the parallel unit element converter according to the order.

7. The method of claim 6, further including the step of applying gains to at least one of the first integral or the second integral such that the gain of the second integral is greater than zero and less than the gain of the first integral, prior to combing the first integral and the second integral.

8. A method of dynamic element matching for selecting elements in an output parallel unit element converter comprising the steps of;

for each input signal to the parallel unit element converter
generating a first integral of the input and generating a first noise shaped signal based on the first integral, and
generating a second integral of the input and generating a second noise shaped signal based on the second integral;
ordering the noise shaped signals such that the first noise shaped signals have higher priority in sorting than the second noise shaped signals; and
selecting elements in the parallel unit element converter according to the order.

\* \* \* \* \*